United States Patent
Agarwal et al.

(10) Patent No.: US 9,064,976 B1
(45) Date of Patent: Jun. 23, 2015

(54) MODELING CHARGE DISTRIBUTION ON FINFET SIDEWALLS

(71) Applicant: International Business Machines Corporation, Armonk, NY (US)

(72) Inventors: Samarth Agarwal, Bangalore (IN); Mohit Bajaj, Bangalore (IN); Terence B. Hook, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/557,578

(22) Filed: Dec. 2, 2014

(51) Int. Cl.
  *H01L 21/302* (2006.01)
  *H01L 21/324* (2006.01)
  *H01L 21/84* (2006.01)
  *H01L 27/12* (2006.01)

(52) U.S. Cl.
  CPC ........... *H01L 21/845* (2013.01); *H01L 27/1203* (2013.01)

(58) Field of Classification Search
  CPC .............. H01L 21/848; H01L 27/1203; H01L 27/1211
  USPC .................................. 438/149, 479–480, 517
  See application file for complete search history.

(56) References Cited

U.S. PATENT DOCUMENTS

| 6,864,520 | B2 | 3/2005 | Fischetti et al. | |
|---|---|---|---|---|
| 8,212,336 | B2 | 7/2012 | Goebel et al. | |
| 8,268,729 | B2 | 9/2012 | Cheng et al. | |
| 8,354,721 | B2 | 1/2013 | Xiao et al. | |
| 8,513,102 | B2 * | 8/2013 | Forbes et al. | 438/514 |
| 8,575,009 | B2 | 11/2013 | Sleight et al. | |

OTHER PUBLICATIONS

Chung et al., "The effects of Low-Angle Off-Axis Substrate Orientation on MOSFET Performance and Reliability", IEEE Transactions on Electron Devices, vol. 38, No. 3, Mar. 1991, pp. 627-633, © 1991 IEEE.
Einstein, "Using the Wigner-Ibach surmise to analyze terrace-width distributions: history, user's guide, and advances", Applied Physics A, Materials Science & Processing, vol. 87, No. 3, 2007, pp. 375-384, Published online: Feb. 28, 2007, © Springer-Verlag 2007.
Jin et al., "Modeling of Surface-Roughness Scattering in Ultrathin-Body SOI MOSFETs", IEEE Transactions on Electron Devices, vol. 54, No. 9, Sep. 2007, pp. 2191-2203, © 2007 IEEE.
Patel et al., "Gate Line Edge Roughness Model for Estimation of FinFET Performance Variability", IEEE Transactions on Electron Devices, vol. 56, No. 12, Dec. 2009, pp. 3055-3063, © 2009 IEEE.
Sato et al., "Effects of corner angle of trapezoidal and triangular channel cross-sections on electrical performance of silicon nanowire field-effect transistors with semi gate-around structure," Solid-State Electronics, vols. 65-66, 2011, pp. 2-8, © 2011 Elsevier Ltd, All rights reserved.

* cited by examiner

Primary Examiner — Cuong Q Nguyen
(74) Attorney, Agent, or Firm — Fusheng Xu (57) ABSTRACT

A method is provided for modeling charge distribution on FinFET sidewalls for estimating variability in device performance. The method includes: inputting structure parameters and simulation parameters for a FinFET structure; identifying a semiconductor-oxide interface in the structure, the interface including a plurality of atomic steps and a plurality of trapped charges; distributing charges at the interface; and performing device simulations and current-voltage analysis upon generating all samples of given number of devices.

18 Claims, 7 Drawing Sheets

MODELING CHARGE DISTRIBUTION ON FINFET SIDEWALLS

FIELD OF THE INVENTION

The present invention relates generally to the field of semiconductor manufacturing, and more particularly to a method for estimating variability in device performance.

BACKGROUND OF THE INVENTION

Device scaling ensures that upcoming CMOS (Complementary metal-oxide semiconductor) technology nodes offer lower cost per function for a chip. However, dimensional scaling increases the importance of the local variation in charge at the semi-conductor-oxide interface. Statistical variation in charge is inversely proportional to the square root of the device gate area. Consequently, scaling results in device electrical performance (e.g., linear current, effective current, and threshold voltage) being more strongly affected by statistical fluctuations in the spatial variation of charge at the semi-conductor-oxide interface.

Conventionally identified and/or modeled sources of charge variation include: (i) random dopant fluctuation (RDF); (ii) dimensional variations (e.g., device length, device width, local channel length, fin width, fin height, and fin angle); (iii) work function variation (e.g. gate work function); (iv) granularity (e.g. metal grain granularity); and (v) oxygen vacancy concentration variation.

SUMMARY

According to an aspect of the present invention, there is a method for modeling charge distribution on FinFET sidewalls for estimating variability in device performance. The method includes: inputting structure parameters and simulation parameters for a FinFET structure; identifying a semiconductor-oxide interface in the structure, the interface including a plurality of atomic steps and a plurality of trapped charges; distributing charges at the interface; and performing device simulations and current-voltage analysis upon generating all samples of given number of devices.

DETAILED DESCRIPTION

Mismatch plays a key role in low-voltage SRAM (static random access memory) functionality. Mismatch is often characterized in terms of a parameter called "AVT," also shown as $\sigma\Delta V_t$, which is the slope of transistor matching (the standard deviation of the difference in threshold voltages between two nearby, nominally identical transistors) relative to the square root of the transistor area. Not all phenomena truly scale with the square root of the transistor area, but this metric is familiar and provides for easy, albeit superficial, benchmarking. Conventionally identified and modeled sources of device variability, as aforementioned, however, do not account for the total variation observed experimentally, as shown in Table 1 comparing conventionally calculated AVT 150 with experimentally measured AVT 160 for an n-type FET (nFET). Specifically, the sources modeled in Table 1 include: (i) random dopant fluctuation (RDF); (ii) metal grain granularity (MGG); (iii) oxygen vacancy (O-V); (iv) gate length variation (GLV); (v) fin width variation (FWV); (vi) fin height variation (FHV); and (vii) fin angle variation (FAV). As seen in Table 1, the calculated AVT value based on conventionally identified sources deviates significantly from the experimentally measured AVT value, which suggests lack of consideration of other sources of charge variation.

TABLE 1

Conventional AVT (150) and experimental AVT (160) for a given n-type FET.

| | RDF | MGG | O-V | GLV | FWV | FHV | FAV | 150 | 160 |
|---|---|---|---|---|---|---|---|---|---|
| nFET | 10.00 | 11.20 | 12.00 | 7.00 | 4.80 | 2.20 | 8.70 | 1.05 | 1.50 |

The introduction of fully depleted transistors with undoped bodies has greatly improved transistor matching relative to conventional doped devices. The elimination of channel doping in FDSOI (fully depleted silicon-on-insulator) and SOI FinFETs has enabled the improvement of matching, reduction in the operating voltage (Vmin) of SRAM, and has brought to the forefront other, heretofore unreported, mechanisms leading to mismatch as well.

Excellent mismatch results have been published in both the planar and the SOI FinFETs manifestations, as shown in Table 2, where published fully-depleted matching data is shown. The planar results are often lower than those for FinFETs, and a value for bulk FinFETs is not reported, which further suggests the contributions of heretofore unconsidered mechanisms to the mismatch. In addition to the aforementioned conventionally identified sources of device variability, electrostatic-driven variations in body thickness specifically affect fully depleted devices. For example, FDSOI are affected through the wafer fabrication process and FinFET are affected through Fin width and angular variation. RDF continues to have an impact through variations in the source dopants and/or the drain dopants.

TABLE 2

Brief list of published fully depleted matching data.

| AVT ($\sigma\Delta V_t$) | TYPE |
|---|---|
| 1.27 | FDSOI |
| 1.30 | FDSOI |
| 1.50 | FinFET |
| 1.75 | FinFET Amorphous Gate |
| Arbitrary Units Only | Bulk FinFET |
| 1.23 | SOI FinFET |
| 1.20 | SOI FinFET |

Some embodiments of the present invention recognize additional sources of charge variation. An exemplary method of modeling charge distribution associated with steps on FinFET sidewalls for estimating variability in device performance is discussed below.

Figure 2:
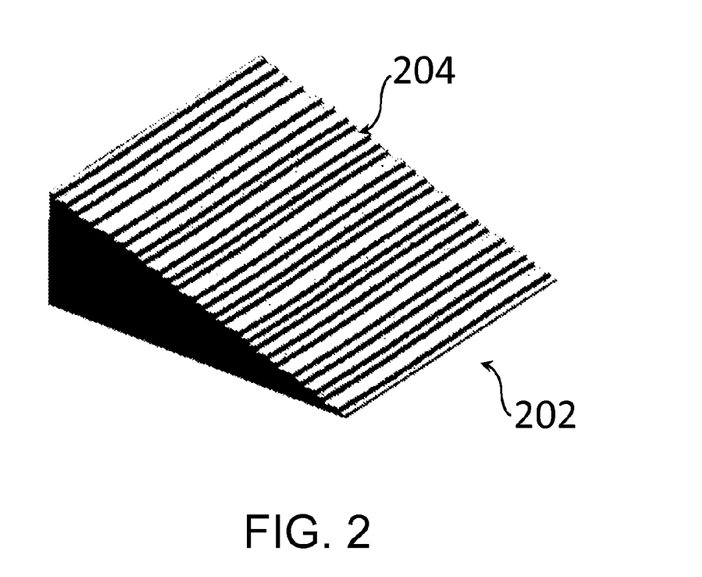
FIG. 2 illustrates a 3D view of an STM image of a stepped Si(111) surface in which each step of this atomic staircase is about 0.3 nm high.

The additional sources of local charge variation at semiconductor-oxide interfaces include: (i) interface traps; and (ii) unpassivated bonds. Interface traps present at the points of disturbance of the silicon lattice in tapered and wavering fins contribute to transistor mismatch. Unpassivated bonds result from the steps on FinFET sidewalls. These steps are generated as a result of: (i) miscut surfaces; (ii) curved surfaces (e.g., nanowires and nanotubes); and/or (iii) lithography processes. In one embodiment, the AVT calculation in Table 3 includes contributions from both conventional sources and from the additional sources, presented herein, specifically, fin miscut and/or misregistration. Table 3 presents the AVT 170 where the additional sources are accounted for. As shown, the contribution from the variation in charge associated with the additional sources is larger than any single other contributions associated with the conventionally identified sources. The "misregistration" is associated with variation in placement (e.g., in a sidewall image transfer process or a lithography process). Comparison between Tables 1 and 3 shows that AVT (1.52) calculated by including the additional identified sources is in an excellent agreement with the experimentally measured AVT value (1.50).

lattice. The miscut angle for surface 202 is about 1° off the crystallographic direction (100) and the vertical axis is thus stretched by a factor of about 15 to clearly show the atomic steps. Unpassivated bonds (e.g., broken or highly strained bonds) from steps along miscut surfaces give rise to a population of charges. A similar situation can also be obtained in the dimension down the length. Further, variations in the fin width or placement (as in a sidewall image transfer process) also necessarily introduce perturbations to the lattice. Consequently, such dimensional variations induce variation in threshold voltage ($V_t$) of transistor due to the variations in charge state associated with the dimensional changes.

Reference will now be made in detail to some embodiments of the present invention, examples of which are illustrated in the accompanying figures. Wherever possible, the same reference numbers will be used throughout the figures to refer to the same or like parts.

In one exemplary embodiment, charge variations associated with steps on the FinFET sidewalls is modeled in the context of transistor matching by using a technology computer-aided design (TCAD) tool. TCAD refers to the use of computer simulations to develop and optimize semiconductor processing technologies and devices.

In this exemplary embodiment, FIELDAY, a proprietary IBM TCAD tool for calculating electrical behavior, is employed. (Note: the term(s) "IBM," and/or "FIELDAY," may be subject to trademark rights in various jurisdictions throughout the world and are used here only in reference to the products or services properly denominated by the marks to the extent that such trademark rights may exist.) FIELDAY solves a system of fully-coupled partial differential equations governing electrostatics, current transport, carrier and lattice energy in a typical semiconductor device, for example, bipolar junction transistor (BJT) and FETs, in hydrodynamic simulation framework. The partial differential equations for potential distribution and carrier continuity equations for electrons and holes are solved using control volume method in FIELDAY. Specifically, the partial-differential equations are discretized to obtain a set of nonlinear equations using control volume method. For the spatial discretization, a 3-D mesh consisting of a mixture of prisms and tetrahedral is used. Further, a fully-coupled Newton scheme is used to

TABLE 3

Improved AVT calculation (170) taking into account additional source(s) of charge variation for a given n-type FET.

| | RDF | MGG | O-V | GLV | FWV | FHV | FAV | ADDITIONAL SOURCE(S) | 170 |
|---|---|---|---|---|---|---|---|---|---|
| nFET | 10.00 | 11.20 | 12.00 | 7.00 | 4.80 | 2.20 | 8.70 | 24.00 | 1.52 |

Figure 1:
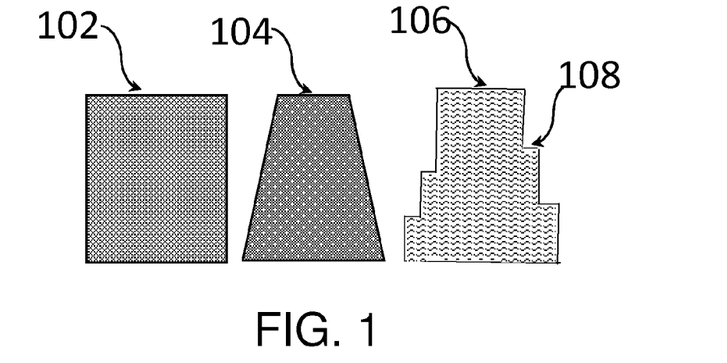
FIG. 1 illustrates schematics of an ideal rectilinear FinFET, idealized tapered FinFET, and realistic FinFET with dimensional variations subject to variations in charge.

In an exemplary embodiment, a FinFET device is considered in light of the well-known "miscut" steps phenomenon. FIG. 1 schematically shows ideal FinFET 102 (untapered and straight) compared with ideal tapered FinFET 104 having some taper in its profile. While for electrostatic analysis the deviations from orthogonal is considered in a continuum sense, in reality, tapered FinFET 106 (FIG. 1) includes jogs (such as jog 108) in the lattice on an atomic level which disrupts the regularity of the lattice.

FIG. 2 shows a perspective view of an STM (scanning tunneling microscope) image of stepped Si(111) surface 202. Each step (e.g. step 204) of this atomic staircase is roughly 0.3 nm high. This is one specific example of atomic steps, or jogs, on a silicon miscut surface. FIG. 2 illustrates how such atomic steps appear on planar silicon, which is cut at an angle to the produce a large sparse linear system of equations from the set of nonlinear equations. A sparse matrix linear solver program is used to obtain the solution of the linear system of equations.

Figure 3:
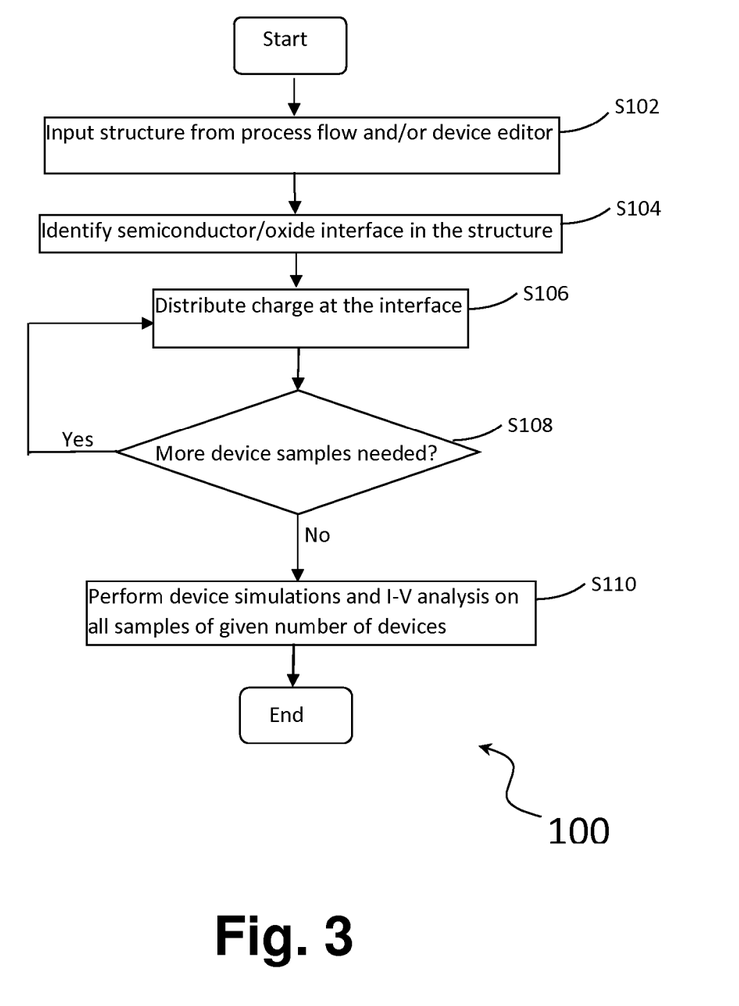
FIG. 3 shows a flow chart for modeling charge distribution associated with steps on the sidewalls of a FinFET according to an embodiment of the present invention.

FIG. 3 shows flowchart 100 depicting a first method for modeling charge distribution associated with steps on FinFET sidewalls according to the present invention.

Processing begins at step S102, where structure information on a FinFET and simulation parameters are input from a process flow, a device editor, or by a user. The structure information may include, but is not limited to: (i) fin width; (ii) fin height; (iii) fin angle; (iv) fin taper profile; (v) gate lengths; (vi) equivalent gate dielectric thickness (e.g. oxide thickness); (vii) source/drain doping profile; (viii) channel doping profile; (ix) channel length; (x) source/drain extension; (xi) buried oxide (BOX) thickness; (xii) sub-fin punchthrough-stopper doping profile; and/or (xiii) gate location relative to extension depth. The simulation parameter set may include, but is not limited to: (i) material electronic properties; (ii) lumped source/drain series resistance; (iii) doping gradient; (iv) density-of-states carrier effective mass; (v) carrier saturation velocity; and/or (vi) metal gate work function.

In one embodiment, the input device structure information comes from process simulation steps using tools like Sentaurus Process or Taurus TSUPREM-4 or through CAD operations and process emulation steps with the aid of tools like Sentaurus Structure Editor. (Note: the term(s) "Sentaurus Process," "Taurus TSUPREM-4," and/or "Sentaurus Structure Editor" may be subject to trademark rights in various jurisdictions throughout the world and are used here only in reference to the products or services properly denominated by the marks to the extent that such trademark rights may exist.) The spatial mesh consisting of a mixture of prisms and tetrahedral may also be generated using those tools.

Processing proceeds to step S104, where semiconductor/oxide interface in the FinFET structure is identified. In this step, geometric information is obtained from the structure including: (i) node; (ii) element; and/or (iii) contact, to identify different interfaces. In this exemplary embodiment, a semiconductor/oxide interface in the structure is identified where charges distribute on the interface between channel and gate dielectric layer.

Processing proceeds to step S106, where charge distribution at the semiconductor/oxide interface is simulated. As described above, tapering of the fin sidewalls leads to steps that are comparable to atomic dimensions. Despite the reconstruction of the surface to attain a lowest energy configuration, there remain unpassivated dangling bonds that can lead to a significant amount of charge being present along these steps on the fin sidewall.

In this exemplary embodiment, the effect of steps is simulated by defining strips of charge on the silicon/oxide interface. Charge is distributed along the randomly appearing steps on the sidewall surface, which can be done by employing, for example, a random number generator, auto-correlation functions, or any other function that can be applied to simulate the distribution of steps.

Figure 4:
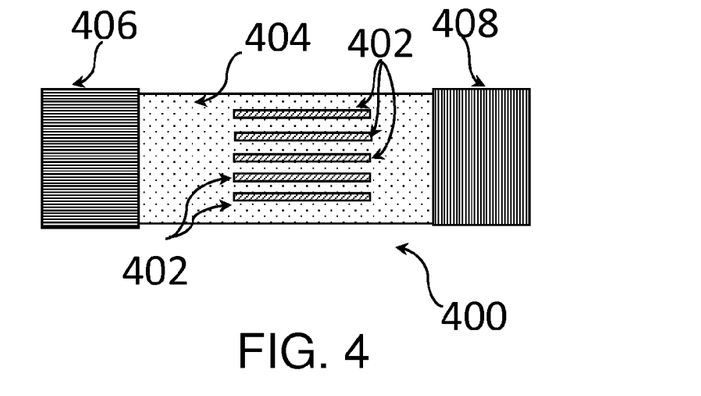
FIG. 4 depicts a resulting structure for simulation where the number of horizontal charge strips placed on the fin sidewall is a function of the average fin taper angle according to an embodiment of the present invention.

The number of steps along the fin height is determined by: (i) the taper angle; and (ii) the dimensions of the fin. The placement of charge strips, however, can be random. FIG. 4 depicts resulting structure 400 (including source 406 and drain 408) for simulation where the number of horizontal charge strips 402 placed on fin sidewall 404 is a function of the average fin taper angle. Similarly, the number and placement of steps along source-to-drain dimension on the fin sidewall is a consequence of the fabrication steps, whether the fin dimension is determined by lithography or by a sidewall image transfer process.

Figure 5:
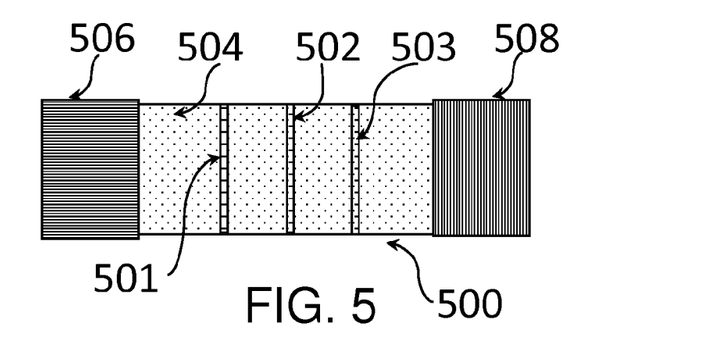
FIG. 5 shows an example for the placement of vertical strips of charge associated with waviness from source to drain according to an embodiment of the present invention.

FIG. 5 illustrates an exemplary placement 500 (including source 506, fin sidewall 504, and drain 508) of strips of charge associated with waviness from source to drain, in which vertical charge strip 501 is placed at source extension, vertical charge strip 502 is placed at gate, and vertical charge strip 503 is placed at drain extension.

In this embodiment charge strips, such as strips 501, 502, 503, and 402, on the fin sidewalls have a density indicative of the fraction of unpassivated bonds. Alternatively, the charge density is determined from ab-initio calculations. In one example, the placement of steps is uniform spatially and correlated on each sidewall of the fin. Alternatively, each sidewall of the fin is treated independently. In this exemplary embodiment, vertical and horizontal strips are treated individually. Alternatively, a more sophisticated approach based on random numbers (e.g., by a random number generator) and/or auto-correlation functions is adopted to capture the full ensemble of devices incorporating both phenomena together (i.e., vertical strips and horizontal strips), as illustrated in FIG. 6.

Figure 6:
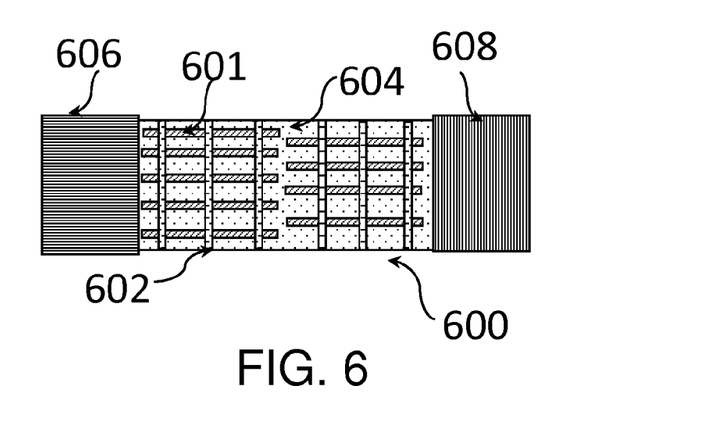
FIG. 6 depicts an alternate representation of charge stripes comprising of horizontal strips from the taper angle and vertical charge strips arising from source-drain lattice irregularities according to an embodiment of the present invention.

FIG. 6 depicts a second embodiment 600 of the present invention. Charge strips include both vertical strips 602 placed according to the fin taper angle, and horizontal strips 601 placed according to source-drain lattice irregularities. Embodiment 600 further includes source 606, fin sidewall 604, and drain 608.

Processing proceeds to step S108, where a decision is made as to whether to include more device samples for simulation. Generating multiple samples for charge distribution allows the calculation of statistics for device performance metrics.

If more samples are desired, the "Yes" branch is followed, returning to step S106 where more device samples are collected for simulation. If no more samples are desired, the "No" branch is followed.

Following the "No" branch, processing proceeds to step S110, where device simulations and current-voltage (I-V) analysis is performed on samples of the given number of devices obtained from step S106. In this step, enough device samples are assumed to be generated, such that device simulations may be performed in step S110.

Accordingly, in the room temperature drift-diffusion device simulation framework, the following basic semiconductor partial differential equations are solved in a fully coupled manner to determine dependent variables, for example, electrostatic potential, and electron and hole concentrations.

$$\nabla \cdot \in \nabla \phi + q(p - n + N) = 0 \quad (1)$$

$$\frac{1}{q} \nabla \cdot J_n + R_n = \frac{\partial n}{\partial t} \quad (2)$$

$$\frac{1}{q} \nabla \cdot J_p + R_p = \frac{\partial p}{\partial t} \quad (3)$$

In above equations, n and P are electron and hole concentrations, respectively, $\phi$ is electrostatic potential, $\in$ is dielectric constant of the material, $R_n$ and $R_p$ are the net generation rate of electron and holes, q is the electronic charge, N is net impurity density, and $J_n$, $J_p$ are current densities. Charges specified on the semi-conductor/oxide interface go into the Poisson equation (equation (1)) that is solved for the electrostatic potential distribution in device and solved self-consistently with carrier transport equations.

Figure 7:
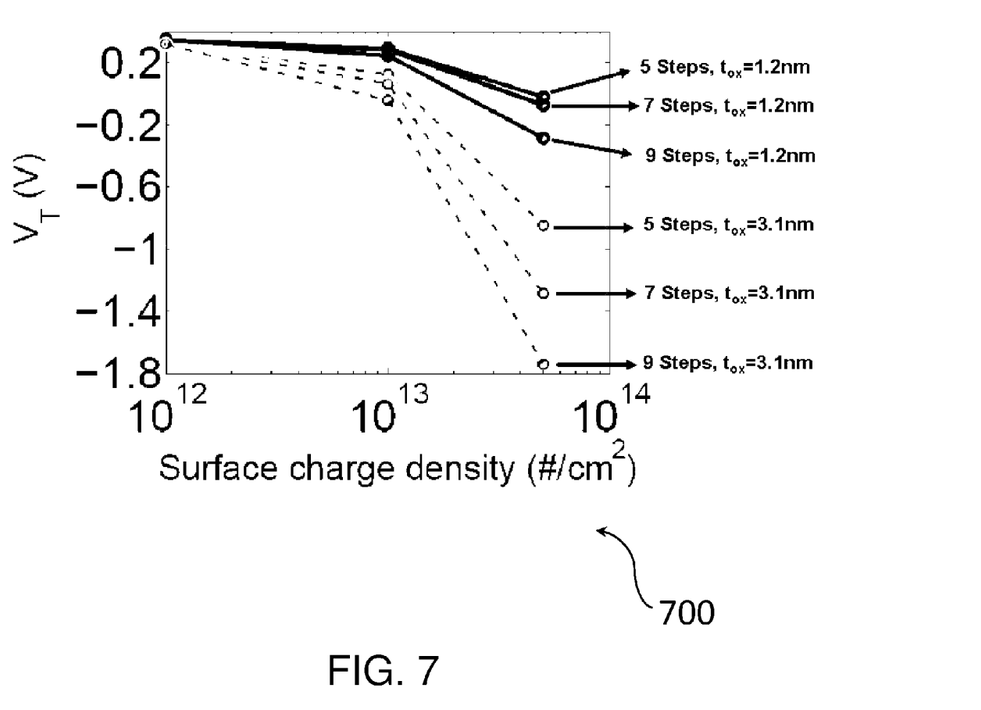
FIG. 7 shows calculated threshold voltages ($V_t$) resulting from horizontal charge strips placed on the fin sidewall for various fin angles at different oxide thickness according to an embodiment of the presentation.

Referring now to FIG. 7, exemplary calculated threshold voltages ($V_t$) are shown in chart 700 according to an embodiment of the present invention. In this example, the threshold voltage results from horizontal charge strips that are placed on the fin sidewall for various fin angles at different gate oxide thicknesses ($t_{ox}$). The number of steps represent the fin angle, i.e., the more steps on the fin sidewall, the larger the tapering angle of the fin. The gate oxide thicknesses ($t_{ox}$) are 1.2 nm and 3.1 nm, respectively. The calculated threshold voltages are plotted as a function of assumed charge density (i.e., surface charge density: #/cm$^2$) in the strips for: (i) several angles; and (ii) the two gate dielectric oxide thicknesses. The surface charge density indicates the fraction of unpassivated bonds at the steps. As seen from FIG. 7, the more steps or the thicker the oxide results in a further shift of the threshold voltage. In this example, no specific implication as to the sign of the threshold voltage shift is intended. The sign of the threshold voltage shift depends on the nature of the unpassivated, or strained, bond at the lattice interruption. Further, the assumed charge sign is positive, but that assumption is not relevant to a statistical calculation.

Figure 8:
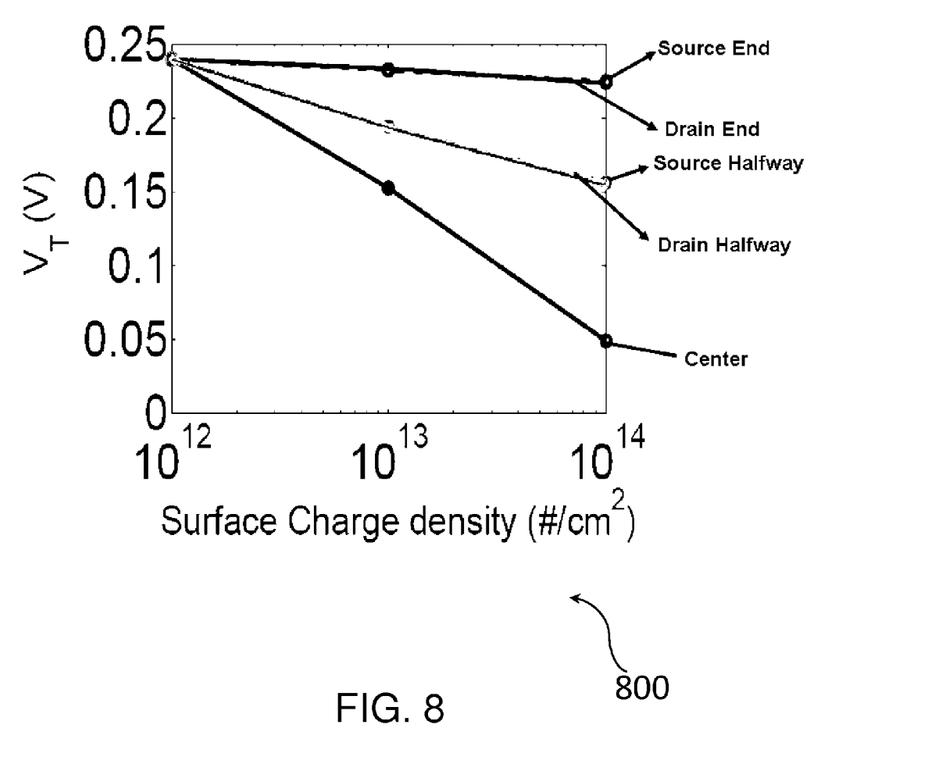
FIG. 8 shows calculated threshold voltages ($V_t$) resulting from vertical charge strips placed from drain to source according to an embodiment of the presentation.

Referring to FIG. 8, exemplary calculated threshold voltages ($V_t$) are shown in chart 800 according to an embodiment of the present invention. In this example, the threshold voltage results from vertical charge strips placed along drain-to-source for a specific fin angle (e.g., 5 steps on the fin sidewall at a specified gate oxide thickness (e.g., 1.2 nm)). The calculated threshold voltages are plotted as a function of assumed charge density (i.e., surface charge density: #/cm$^2$) in the strips and locations of a single lattice irregularity (i.e, step/strip) along the source to the drain. The surface charge density indicates the fraction of unpassivated bonds at the steps. The locations of strips placed along the source to the drain are designated as: center, source end, source halfway, drain end, and drain halfway, respectively. As seen in FIG. 8, the largest impact on threshold voltage is from the charge strip placed on the gate (e.g., center position). Charges placed outside of the gate have no impact on the threshold voltage (e.g., source end or drain end). While a lattice discontinuity located within the active channel is quite important, as expected, the response (e.g., threshold voltage) depends on the location of the charge in the channel (e.g., source halfway or drain halfway). In this example, no specific implication as to the sign of the threshold voltage shift is intended. The sign of the threshold voltage shift depends on the nature of the unpassivated, or strained, bond at the lattice interruption. Further, the assumed charge sign is positive, but that assumption is not relevant to a statistical calculation.

Figure 9:
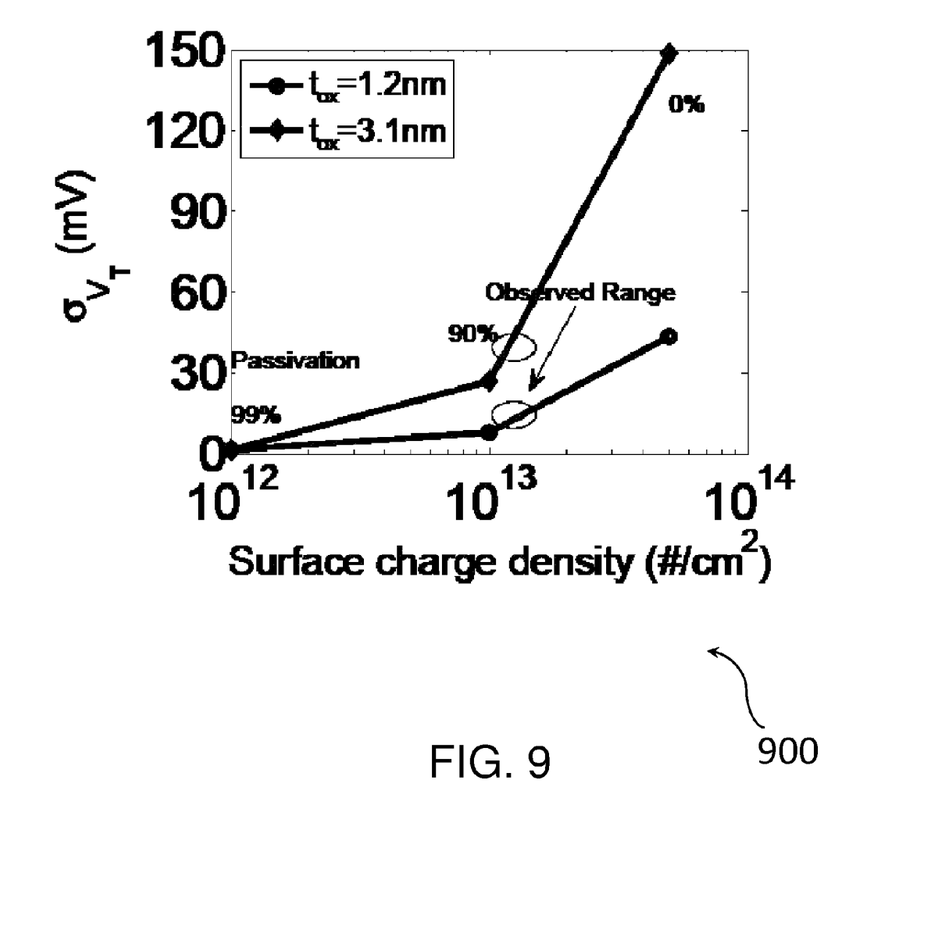
FIG. 9 shows threshold voltage standard deviation simulated for different oxide thickness using horizontal charge strips on the fin sidewall according to an embodiment of the presentation.

Referring to FIG. 9, exemplary threshold voltage standard deviations ($\sigma_{Vt}$) are shown in chart 900 according to an embodiment of the present invention. In this example, the standard deviation is based on simulation of different gate oxide thicknesses using horizontal charge strips on a fin sidewall. Statistics are applied to the fin taper angle (i.e., number of strips and placement of strips) to calculate the resultant mismatch ($\sigma_{Vt}$) from this mechanism (i.e., fin angle variation) for a +/−3 degree deviation in fin angle. The calculated threshold voltage standard deviation is plotted as a function of assumed charge density (i.e., surface charge density: #/cm$^2$) in the strips placed on the fin sidewall for two gate oxide thicknesses (i.e., 1.2 nm and 3.1 nm). The surface charge density indicates the fraction of unpassivated bonds at the steps. For example, the 99%, 90%, and 0% points in chart 900 represent the passivation percentage of unpassivated bonds at steps. In this example, no specific implication as to the sign of the threshold voltage shift is intended. The sign of the threshold voltage depends on the nature of the unpassivated or strained bond at the lattice interruption. Further, the assumed charge sign is positive, but that assumption is not relevant to a statistical calculation. In the following section, the simulated results shown in FIGS. 7, 8, and 9 are compared with experimentally measured FinFET hardware data.

Figure 10:
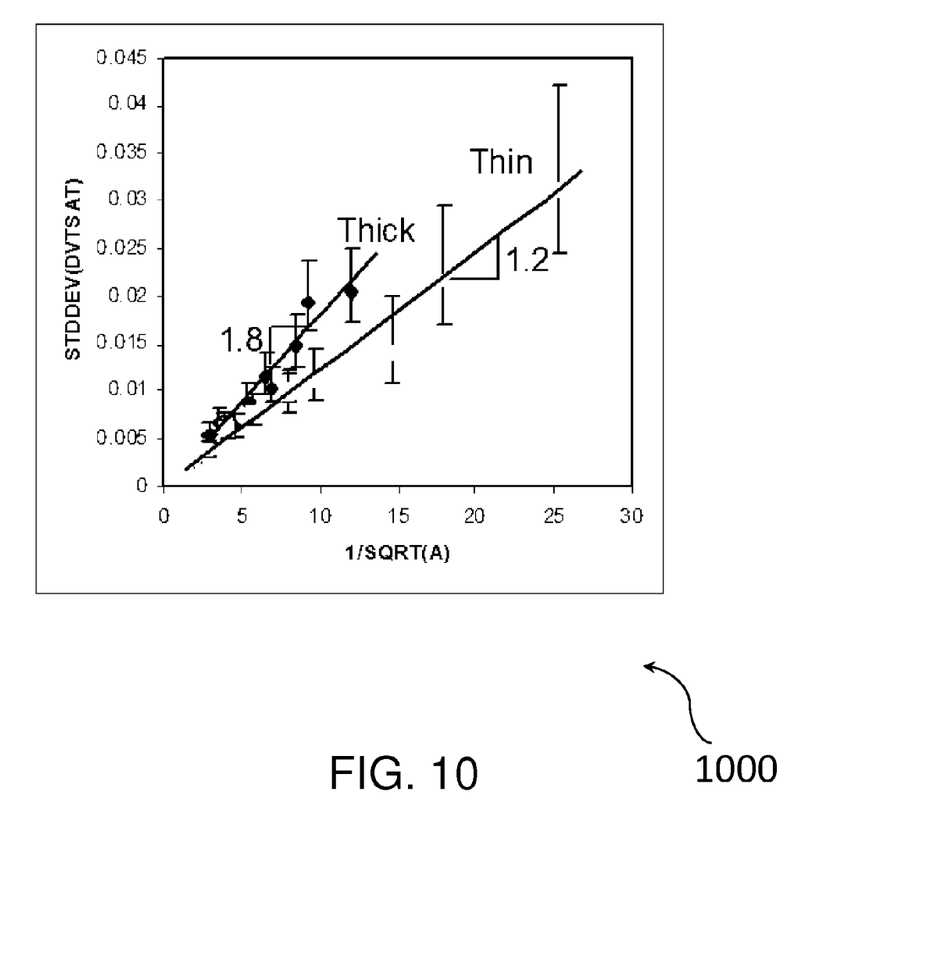
FIG. 10 shows a Pelgrom plot for undoped FinFETs for thin (1.2 nm) and thick (3.2 nm) dielectrics.

Referring to FIG. 10 Pelgrom plot 1000 illustrates an exemplary threshold voltage matching data ($\sigma\Delta V_t$, as in saturated) experimentally measured for undoped FinFETs for different gate oxide thicknesses (i.e., 1.2 nm and 3.2 nm) according to the present invention. The FinFETs for which hardware matching data is obtained are undoped SOI (silicon-on-insulator) nFETs (n-type FET). In the Pelgrom plot, the standard deviation of the difference in threshold voltage between two nearby, nominally identical transistors ($\sigma\Delta V_t$, as in saturated), is plotted relative to the square root of the transistor area (1/sqrt(A)). Mismatch is characterized in terms of the parameter AVT, which is the slope of transistor matching data plot. The thick gate oxide device shows larger mismatch (slope=1.8) than the thin gate oxide device (slope=1.2). This does not approach the degree of mismatch conventionally observed in dopant-dominated devices.

Referring now to Table 4, below, the calculated mismatch, or AVT, is shown for: (i) contributions simulated according to an embodiment of the present invention; and (ii) contributions expected from various conventionally accepted mechanisms for appropriate dimensional variation assumptions. These calculated AVTs are shown alongside the measured, or actual AVT. Table 4 presents the AVTs with reference to both thin dielectric devices (gate length Lgate=20 nm) and thick dielectric devices (gate length Lgate=30 nm).

In addition to conventional variation sources, used in calculating conventional AVT 150, variations in electrostatics arising from fin angle variations, and the oxygen-vacancy mechanism are considered in calculating improved AVT 170. Statistically combining these elements, the additional charge variation needed to approach the empirical data, also referred to herein as measured data, 160 requires that the magnitude of the charge be consistent for thick- and thin-dielectrics. As seen in FIGS. 7 and 9, a charge variation of this magnitude is associated with a charge density in the strip of just over 1×10$^{13}$ cm$^{-2}$ (as shown by circled areas in chart 900). Such charge density would be present if approximately 10% of the bonds in the disrupted area are unpassivated. The 10% assumption is reasonable. Table 4 demonstrates that the calculated mismatch data 170 (where the additional contributions identified in this disclosure) is located alongside experimentally measured mismatch data 160 for both thick- and thin-dielectric devices.

TABLE 4

Numerical assessment of mismatching data and corresponding empirical results for both a thin oxide and a thick oxide.

| | RDF | MGG | O-V | GLV | FWV | FHV | FAV | ADDITIONAL SOURCE(S) | 170 | 160 |
|---|---|---|---|---|---|---|---|---|---|---|
| THICK | 15.40 | 7.10 | 12.80 | 0.60 | 1.33 | 1.83 | 2.47 | 20.30 | 2.08 | 1.8-2 |
| THIN | 10.70 | 14.50 | 12.80 | 7.00 | 4.80 | 2.20 | 8.70 | 12.00 | 1.18 | 1.20 |

Although the matching is understood to be a function only of the variation in taper angle, a change in the nominal threshold voltage is as well expected as a function of fin angle (as more steps occur on the more tapered fin), and that this shift would be larger on thick dielectric devices.

Some embodiments of the present invention may include one, or more, of the following features, characteristics and/or advantages: (i) Interface traps present at the points of disturbance of the silicon lattice in tapered and wavering fins are shown to contribute to transistor mismatch; (ii) unpassivated bonds due to steps on miscut surfaces, curved surfaces or lithography processes contribute to transistor mismatch; (iii) misregistration along the source/drain axis contributes to transistor mismatch; (iv) the consideration of charge variation mechanisms identified in the present invention improves the quantitative understanding of matching in undoped thin- and thick-dielectric SOI FinFETs; (v) a methodology of statistically representing the charge variation associated with variation sources identified in the present invention is described in a TCAD framework to show that the results of these calculations represent a plausible and numerically reasonable explanation for empirically observed matching and threshold voltage variation; (vi) the nominal threshold voltage is shown to be a function of fin taper angle; (vii) control of the fin profile is critical to threshold voltage control and matching; and/or (viii) the methodology and concepts disclosed in the present invention equally apply to both n-type FETs and p-type FETs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A method of modeling charge distribution associated with steps on FinFET sidewalls for estimating variability in device performance, comprising:
   inputting structure parameters and simulation parameters for a FinFET structure;
   identifying a semiconductor-oxide interface of the FinFET structure, the interface including a plurality of atomic steps and a plurality of trapped charges;
   distributing charges at the semiconductor-oxide interface; and
   performing device simulation and current-voltage analysis upon generating samples of a given number of devices.

2. The method of claim 1, wherein the structure parameters include: (i) fin width; (ii) fin height; (iii) fin angle; (iv) fin taper profile; (v) gate length; (vi) equivalent gate dielectric thickness; (vii) source/drain doping profile; (viii) channel doping profile; (ix) channel length; (x) source/drain extension; (xi) buried oxide thickness; (xii) sub-fin punchthrough-stopper doping profile; and (xiii) gate location relative to extension depth.

3. The method of claim 1, wherein the simulation parameters include: (i) material electronic properties; (ii) lumped source/drain series resistance; (iii) doping gradient; (iv) density-of-states carrier effective mass; (v) carrier saturation velocity; and (vi) metal gate work function.

4. The method of claim 1, wherein the structure parameters are generated from one of a process flow, a device editor, and a user.

5. The method of claim 1, wherein the simulation parameters are generated from one of a process flow, a device editor, and a user.

6. The method of claim 1, wherein the semiconductor-oxide interface is located between a channel layer of the FinFET structure and a gate dielectric layer of the FinFET structure.

7. The method of claim 1, wherein the plurality of atomic steps appear on the semiconductor-oxide interface in a random manner.

8. The method of claim 7, wherein the random manner in which the plurality of atomic steps appears is generated by one of: (i) a random number generator; (ii) an auto-correlation function; and (iii) any other function that simulates the distribution of atomic steps.

9. The method of claim 1, wherein the plurality of atomic steps is determined, at least in part, by the structure parameters.

10. The method of claim 1, wherein the atomic steps are generated based, at least in part, on one of the following: (i) a miscut surface; (ii) a lithography process; (iii) a curved geometry of a nanowire; and (iv) a curved geometry of a nanotube.

11. The method of claim 1, wherein the step of distributing charges at the interface includes distributing one of: trapped charges, and charges from unpassivated bonds generated at the atomic steps.

12. The method of claim 1, wherein the step of distributing charges at the interface includes distributing a plurality of charge strips at the plurality of atomic steps.

13. The method of claim 12, wherein the plurality of charge strips have a charge density indicative of unpassivated bonds generated at the atomic steps.

14. The method of claim 1, wherein the step of performing device simulation and current-voltage analysis upon generating samples of the given number of devices includes generating threshold voltages of the given number of devices by solving a system of fully coupled partial differential equations in drift diffusion or hydrodynamic transport model framework governing electrostatics, current and energy transport in a semiconductor device.

15. The method of claim 1, wherein the step of performing device simulation and current-voltage analysis upon generating samples of the given number of devices includes generating a threshold voltage standard deviation of the given number of devices by solving a system of fully-coupled partial differential equations in drift diffusion or hydrodynamic transport model framework governing electrostatics, current and energy transport in a semiconductor device.

16. The method of claim 1, wherein the step of performing device simulation and current-voltage analysis upon generating samples of the given number of devices includes generating threshold voltage matching data of the given number of devices by solving a system of fully-coupled partial differential equations in drift diffusion or hydrodynamic transport model framework governing electrostatics, current and energy transport in a semiconductor device.

17. The method of claim 16, wherein the step of performing device simulation and current-voltage analysis upon generating samples of the given number of devices further includes generating threshold voltage mismatching data of the given number of devices by solving a system of fully-coupled partial differential equations in drift diffusion or hydrodynamic transport model framework governing electrostatics, current and energy transport in a semiconductor device.

18. The method of claim 17, wherein the step of performing device simulations and current-voltage analysis upon generating samples of given number of devices further includes comparing the threshold voltage mismatching data of the given number of devices with experimentally measured mismatching data of FinFET hardware for estimating device performance variability.

* * * * *